(12) United States Patent
Ohashi

(10) Patent No.: US 10,438,845 B2
(45) Date of Patent: Oct. 8, 2019

(54) SEMICONDUCTOR DEVICE AND MANUFACTURING METHOD THEREOF

(71) Applicant: TOSHIBA MEMORY CORPORATION, Minato-ku (JP)

(72) Inventor: Takashi Ohashi, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/104,221

(22) Filed: Aug. 17, 2018

(65) Prior Publication Data

US 2019/0273021 A1 Sep. 5, 2019

(30) Foreign Application Priority Data

Mar. 2, 2018 (JP) ................. 2018-037804

(51) Int. Cl.
*H01L 21/70* (2006.01)
*H01L 21/768* (2006.01)
*H01L 23/535* (2006.01)
*H01L 21/02* (2006.01)
*H01L 21/311* (2006.01)

(52) U.S. Cl.
CPC .... *H01L 21/76832* (2013.01); *H01L 21/0217* (2013.01); *H01L 21/02164* (2013.01); *H01L 21/31144* (2013.01); *H01L 21/76804* (2013.01); *H01L 21/76831* (2013.01); *H01L 21/76877* (2013.01); *H01L 21/76895* (2013.01); *H01L 23/535* (2013.01)

(58) Field of Classification Search
CPC ......... H01L 21/76804; H01L 21/76831; H01L 21/76832; H01L 21/76877; H01L 21/76895; H01L 23/535
See application file for complete search history.

(56) References Cited

U.S. PATENT DOCUMENTS

| 6,169,024 B1 * | 1/2001 | Hussein ............ H01L 21/76807 257/E21.579 |
| 2009/0061615 A1 | 3/2009 | Cho et al. |
| 2017/0018460 A1 * | 1/2017 | Hsu ................. H01L 21/823475 |

FOREIGN PATENT DOCUMENTS

| JP | 9-22882 | 1/1997 |
| JP | 2008-305921 | 12/2008 |
| JP | 2009-60074 | 3/2009 |

* cited by examiner

*Primary Examiner* — David C Spalla
(74) *Attorney, Agent, or Firm* — Oblon, McClelland, Maier & Neustadt, L.L.P.

(57) ABSTRACT

A semiconductor device according to the present embodiment is provided with a lower layer. A first film is provided on the lower layer. A first side-wall film covers a contact hole provided in the first film, along a side wall in the contact hole and from a lower end of the contact hole to an upper end of the contact hole. A second side-wall film is provided on the side wall in the contact hole via the first side-wall film, to cover the contact hole from a position higher than a lower end of the first side-wall film to the upper end of the contact hole. A conductor is provided inside the first and second side-wall films in the contact hole. An upper layer is provided on the first film.

4 Claims, 8 Drawing Sheets

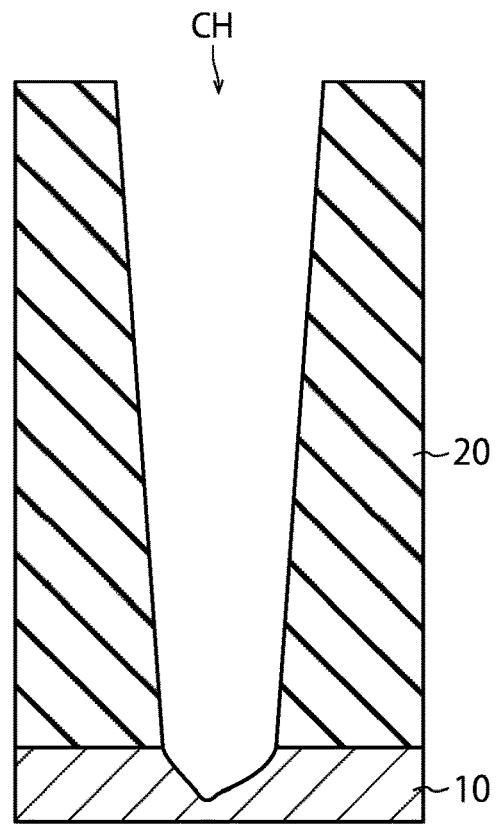
FIG. 4
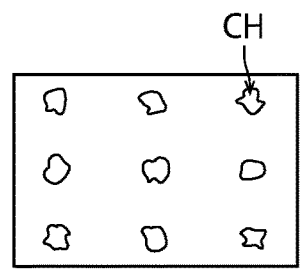 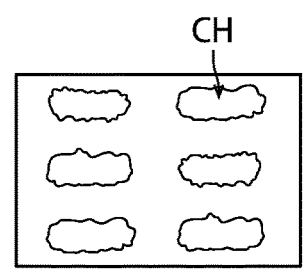
FIG. 5A  FIG. 5B

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2018-037804, filed on Mar. 2, 2018, the entire contents of which are incorporated herein by reference.

FIELD

The embodiments of the present invention relate to a semiconductor device and a manufacturing method thereof.

BACKGROUND

As the miniaturization of semiconductor devices proceeds, contact plugs provided on a substrate, wiring, etc. have a higher aspect ratio. In the formation of a contact hole of a high aspect ratio, if a deposit is attached to the inner wall of the contact hole or, conversely, if the inner wall of the contact hole is hollowed, the bottom shape of the contact hole becomes a distorted shape largely different from the original layout shape. In this case, when a spacer film is formed on the inner surface of the contact hole, the spacer film may be locally formed thick on the bottom surface of the contact hole.

When the spacer film is locally formed thick on the bottom surface of the contact hole, it is difficult to remove the spacer film from the bottom surface of the contact hole, while maintaining the spacer film on the side surface of the contact hole. In this case, the contact resistance to the lower layer becomes high, so that contact failure tends to occur.

BRIEF DESCRIPTION OF THE DRAWINGS

FIG. 4 is a sectional view showing an example of a manufacturing method of the semiconductor device according to the present embodiment;

FIG. 5A is a plan view showing an example of the bottom shape of a contact hole;

FIG. 5B is a plan view showing an example of the bottom shape of a contact hole;

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction. The drawings are schematic or conceptual, the scale and the like of each part thereof being not necessarily the same as actual ones. In the specification and drawings, the same signs are given to the same elements as those described with reference to the drawings previously shown, a detailed description thereof being omitted, as required.

A semiconductor device according to the present embodiment is provided with a lower layer. A first film is provided on the lower layer. A first side-wall film covers a contact hole provided in the first film, along a side wall in the contact hole and from a lower end of the contact hole to an upper end of the contact hole. A second side-wall film is provided on the side wall in the contact hole via the first side-wall film, to cover the contact hole from a position higher than a lower end of the first side-wall film to the upper end of the contact hole. A conductor is provided inside the first and second side-wall films in the contact hole. An upper layer is provided on the first film.

Figure 1:
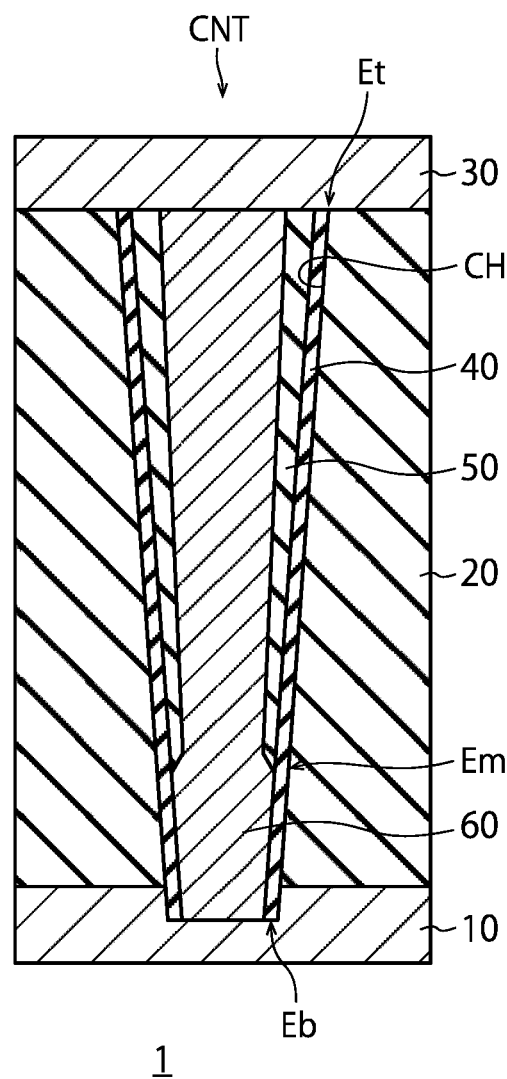
FIG. 1 is a sectional view showing a configuration example of a contact of a semiconductor device according to the present embodiment.

FIG. 1 is a sectional view showing a configuration example of a contact of a semiconductor device according to the present embodiment. A semiconductor device 1 according to the present embodiment may be a semiconductor memory such as a NAND EEPROM (Electrically Erasable Programmable Read-Only Memory) or another semiconductor integrated-circuit device. A contact CNT may, for example, be a contact that electrically connects a lower-layer wiring layer and an upper-layer wiring layer. Or the contact CNT may electrically connect a semiconductor substrate as a lower layer and wiring as an upper layer. Or the contact CNT may be applied to memory holes of a three-dimensional memory cell array having memory cells arranged three-dimensionally.

The contact CNT is provided with a lower layer 10, an interlayer insulating film 20, an upper layer 30, a first side-wall film 40, a second side-wall film 50, and a contact plug 60.

The lower layer 10 may, for example, be a semiconductor substrate or a lower-layer wiring layer. The contact plug 60 is electrically connected to an impurity diffusion layer provided to the semiconductor substrate or electrically connected to wiring of the lower-layer wiring layer. The interlayer insulating film 20 as a first film is provided on the lower layer 10 to electrically isolate the lower layer 10 and the upper layer 30 from each other. The upper layer 30 is provided on the interlayer insulating film 20, which may, for example, be an upper-layer wiring layer. The wiring of the upper layer 30 is electrically connected to the impurity diffusion layer of or the wiring of the lower layer 10 via the contact plug 60.

A contact hole CH is provided inside the interlayer insulating film 20. The contact hole CH is provided from the upper surface of the interlayer insulating film 20 to the upper surface of the lower layer 10. The contact plug 60 is provided inside the contact hole CH. The contact hole CH has a high ratio of depth to opening diameter (an aspect ratio). The aspect ratio is, for example, about 20 or higher.

The first side-wall film 40 is provided on a side surface inside the contact hole CH to cover the contact hole CH from the bottom to top of the contact hole CH. In detail, the contact hole CH covers the entire side surface of the contact hole CH from a lower end Eb of to an upper end Et of the contact hole CH. As for the first side-wall film 40, for example, an insulating film such as a silicon oxide film or a silicon nitride film is used.

The second side-wall film 50 is provided on the side surface inside the contact hole CH via the first side-wall film 40. The second side-wall film 50 covers the contact hole CH from an intermediate position Em higher than the lower end Eb of the first side-wall film 40 to the upper end Et of the contact hole CH. As for the second side-wall film 50, for example, an insulating film such as a silicon oxide film or a silicon nitride film is used. As described above, the first side-wall film 40 covers the entire inner wall of the contact hole CH. By contrast, although the second side-wall film 50 covers the upper portion of the inner wall of the contact hole CH, the second side-wall film 50 is not provided on the lower portion of the inner wall of the contact hole CH. In other words, at the lower portion of the contact hole CH, and between the contact plug 60 and the side surface of the contact hole CH, one layer of the first side-wall film 40 only is provided, with no second side-wall film 50 being provided. On the other hand, at the upper portion of the contact hole CH, and between the contact plug 60 and the side surface of the contact hole CH, two layers of the first side-wall film 40 and the second side-wall film 50 are provided.

Accordingly, as described later, it is achieved to restrict the contact area between the bottom surface of the contact plug 60 and the lower layer 10 from being extremely small to keep the contact resistance between the contact plug 60 and the lower layer 10 comparatively low.

Figure 2:
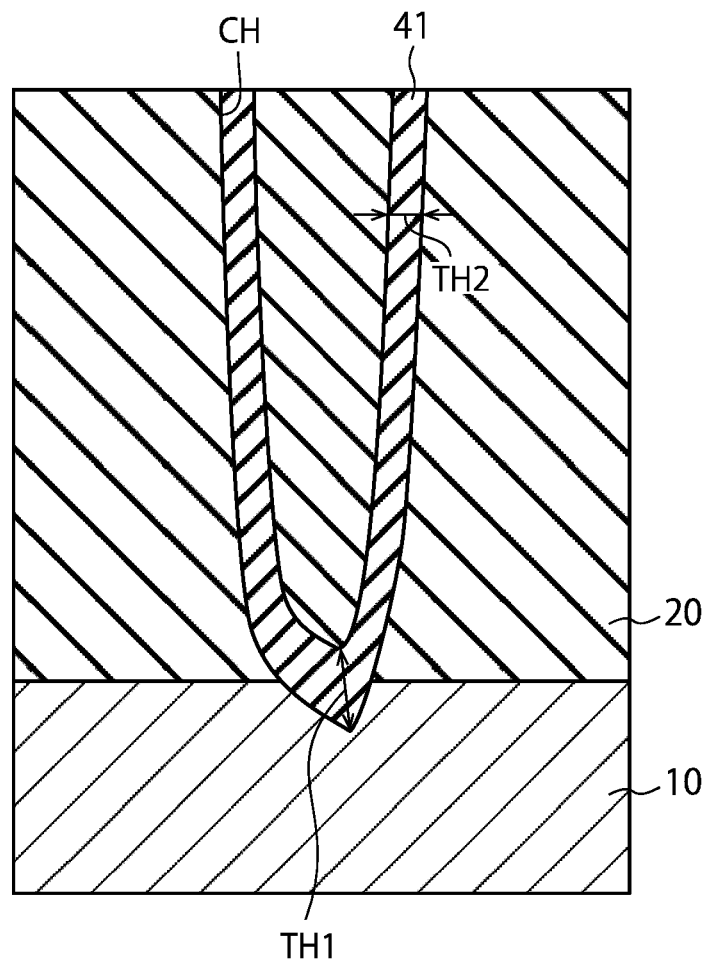
FIG. 2 is a sectional view showing a distorted bottom shape of a contact hole.

In the formation of the contact hole CH, if a deposit is attached to the inner wall of the contact hole CH or, conversely, if the inner wall of the contact hole CH is hollowed, the bottom shape of the contact hole CH becomes a distorted shape largely different from the original layout shape. For example, FIG. 2 is a sectional view showing a distorted bottom shape of the contact hole CH. FIG. 2 shows a cross section of the contact hole CH just after the formation of the spacer film 41. If a deposit is attached to the inner wall of the contact hole CH or if the inner wall is hollowed, the contact hole CH may have a tapered bottom shape, as shown in FIG. 2. In this case, if the spacer film 41 is formed at once under a good coverage condition, the spacer film 41 may be locally formed thick on the bottom of the contact hole CH. In FIG. 2, the spacer film 41 is formed with a thickness TH1 on the bottom of the contact hole CH. The thickness TH1 is much larger than a thickness TH2 of the spacer film 41 provided on the side surface of the contact hole CH. The bottom of the contact hole CH is required to be opened so that the contact plug 60 has contact with the lower layer 10. However, as shown in FIG. 2, when the spacer film 41 is formed on the bottom of the contact hole CH with a very large thickness, it is difficult to penetrate through the bottom of the contact hole CH even by etch back.

Figure 3:
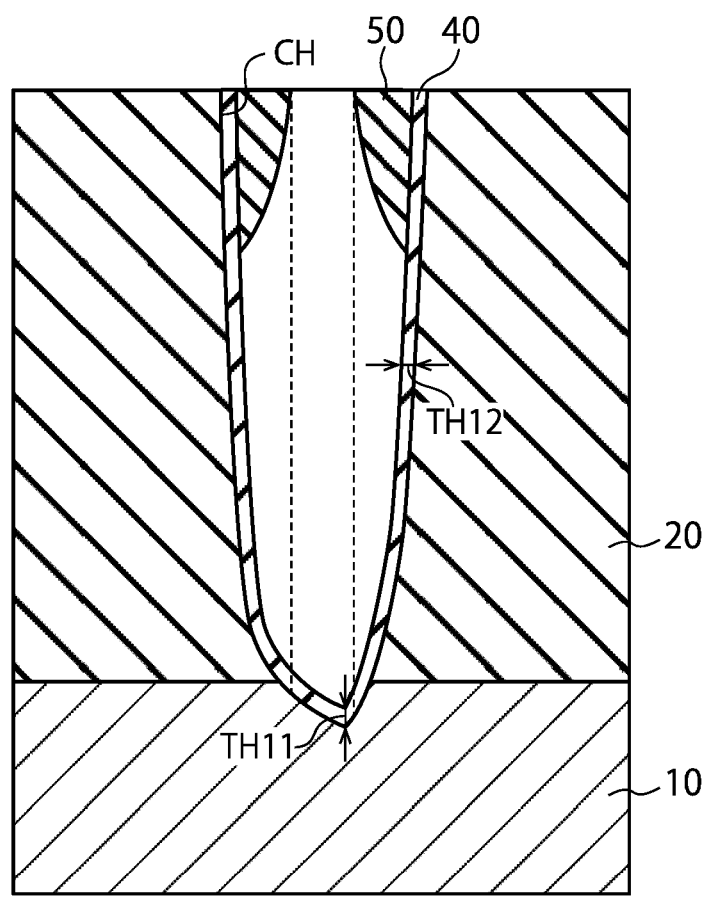
FIG. 3 is a sectional view showing the bottom shape of a contact hole according to the present embodiment.

In contrast to the above, FIG. 3 is a sectional view showing the bottom shape of the contact hole CH according to the present embodiment. FIG. 3 also shows the cross section of the contact hole CH just after the formation of a side-wall film inside the contact hole CH. The contact hole CH has a tapered bottom shape, like the contact hole CH shown in FIG. 2. The first side-wall film 40 having a smaller film thickness than the spacer film 41 covers the entire inner wall of the contact hole CH at a comparatively small thickness. Although, like the spacer film 41 shown in FIG. 2, the first side-wall film 40 is formed under a film formation condition with good coverage, the first side-wall film 40 is formed thinner than the spacer film 41. Therefore, as shown in FIG. 3, although a thickness TH11 of the first side-wall film 40 on the bottom of the contact hole CH is larger than a thickness TH12 of the first side-wall film 40 on the side surface of the contact hole CH, the difference between the thicknesses TH11 and TH12 is small.

Moreover, in the present embodiment, the second side-wall film 50 is formed under a film formation condition with worse coverage than the first side-wall film 40. Accordingly, the second side-wall film 50 covers the upper portion of the inner wall of the contact hole CH, without being provided on the lower portion of the inner wall of the contact hole CH. In other words, at the lower portion of the contact hole CH, one layer of the first side-wall film 40 is provided on the side wall of the contact hole CH, whereas, at the upper portion of the contact hole CH, two layers of the first and second side-wall films 40 and 50 are provided.

Accordingly, what is provided on the bottom of the contact hole CH is only the first side-wall film 40 of a comparatively thin film thickness. Therefore, the first side-wall film 40 on the bottom of the contact hole CH can be removed by etch back relatively easily.

Moreover, at the upper portion of the contact hole CH, two layers of the first and second side-wall films 40 and 50 are formed with a comparatively large thickness. Therefore, the second side-wall film 50 functions as a mask in etching back the first side-wall film 40 on the bottom of the contact hole CH. Accordingly, in etch back, without removing too much the first side-wall film 40 of a comparatively small thickness on the side wall of the contact hole CH, the first side-wall film 40 of a comparatively large thickness on the bottom of the contact hole CH can be selectively removed with no failure. As a result, the contact plug 60 of FIG. 1 can have contact with the lower layer 10 with low resistance even though the contact hole CH has a high aspect ratio.

Subsequently, a manufacturing method of the semiconductor device 1 according to the present embodiment will be explained.

FIG. 4 is a sectional view showing an example of the manufacturing method of the semiconductor device according to the present embodiment. Firstly, after a semiconductor element (not shown) is formed on a semiconductor substrate, wiring is formed on the semiconductor substrate. The lower layer 10 according to the present embodiment may, for example, be the semiconductor substrate or the wiring.

Subsequently, by CVD (Chemical Vapor Deposition) or the like, the interlayer insulating film 20 is formed on the lower layer 10, as a first film. The interlayer insulating film 20 may, for example, be an insulating film of a silicon oxide film.

Subsequently, by lithography and RIE (Reactive Ion Etching), as shown in FIG. 4, the contact hole CH is formed so as to reach the lower layer 10 from the upper surface of the interlayer insulating film 20. The contact hole CH has an extremely high aspect ratio. For example, the contact hole CH has a depth of about 10 μm, an opening diameter of about 200 nm, and a bottom surface diameter of about 150 nm.

In the formation of the contact hole CH having a high aspect ratio, when a deposit is attached to the inner wall of the contact hole CH or the inner wall of the contact hole CH is hollowed, the contact hole CH is etched with the deposit or the hollowed portion as a mask. Therefore, the contact hole CH has a distorted bottom surface shape. For example, FIGS. 5A and 5B are plan views showing examples of the bottom surface shape of the contact hole CH. For example, even if a designed planar layout is a circle, the contact hole CH may have a distorted bottom surface shape such as shown in FIG. 5A, different from the circle. Moreover, even if a designed planar layout is oval or elliptic, the contact hole CH may have a distorted bottom surface shape such as shown in FIG. 5B, different from an oval or elliptic shape. In such a case, as described above, the bottom surface of the contact hole CH may be uneven, not flat, and have a convex and concave shape as shown in FIG. 4.

Figure 6:
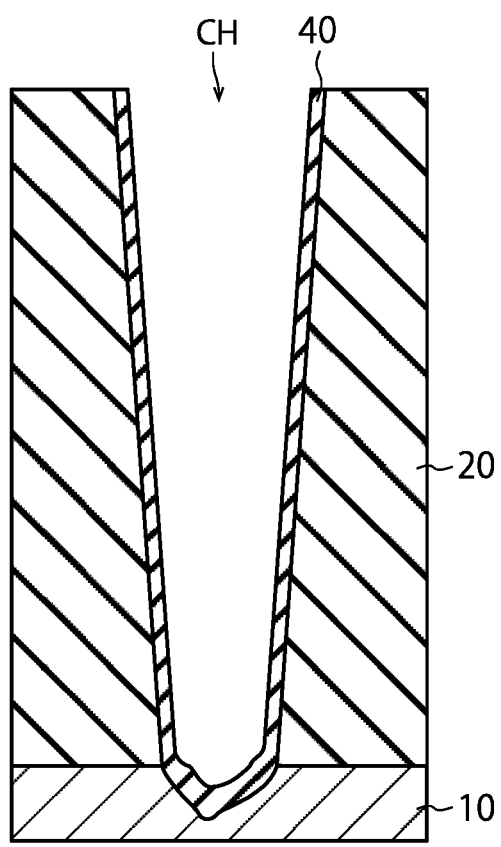
FIG. 6 is a sectional view showing an example of the manufacturing method of the semiconductor device, following to FIG. 4.

Subsequently, by low temperature CVD (LTO-CVD (Low-Temperature Oxide Chemical Vapor Deposition)) or low temperature ALD (LTO-ALD (Atomic Layer Deposition)), as shown in FIG. 6, the first side-wall film 40 is formed thin on the inner wall of the contact hole CH. In this step, a film-forming source gas is supplied at a comparatively-large first supply amount so as to reach the bottom of the contact hole CH. Accordingly, the first side-wall film 40 is formed on the entire bottom and side surfaces inside the contact hole CH with good coverage. For example, the film-forming source gas is an aminosilane-based gas and the film-forming temperature is about 300° C. The supply amount of the aminosilane-based gas is about 10 times the supply amount for the second side-wall film 50. Accordingly, as the first side-wall film 40, for example, a silicon oxide film or a silicon nitride film is formed on the entire bottom and side surfaces inside the contact hole CH with good coverage.

Figure 7:
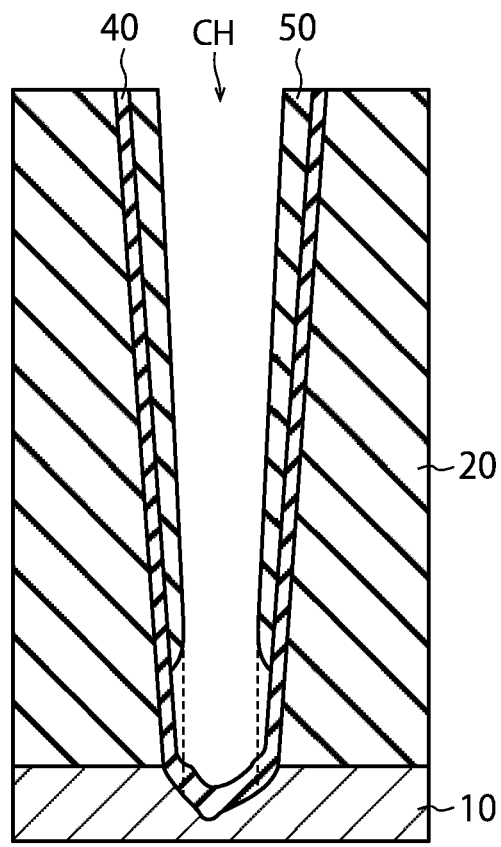
FIG. 7 is a sectional view showing an example of the manufacturing method of the semiconductor device, following to FIG. 6.

Subsequently, by PE-CVD (Plasma Enhanced-CVD) or PE-ALD (Plasma Enhanced-ALD), as shown in FIG. 7, the second side-wall film 50 is formed on the first side-wall film 40 on the inner wall of the contact hole CH. In this step, a film-forming source gas is supplied at a comparatively-small second amount so as not to reach the bottom of the contact hole CH.

Accordingly, the second side-wall film 50 is formed, not on the bottom surface of the contact hole CH, but above the side surface of the contact hole CH. In other words, the second side-wall film 50 is formed with bad coverage. For example, the film-forming source gas is an aminosilane-based gas and the film-forming temperature is about 100° C. or lower. The supply amount of the aminosilane-based gas is about 1/10 the supply amount for the first side-wall film 40. Accordingly, as the second side-wall film 50, for example, a silicon oxide film or a silicon nitride film is formed only at the upper side surface of the contact hole CH with a comparatively large thickness.

Figure 8:
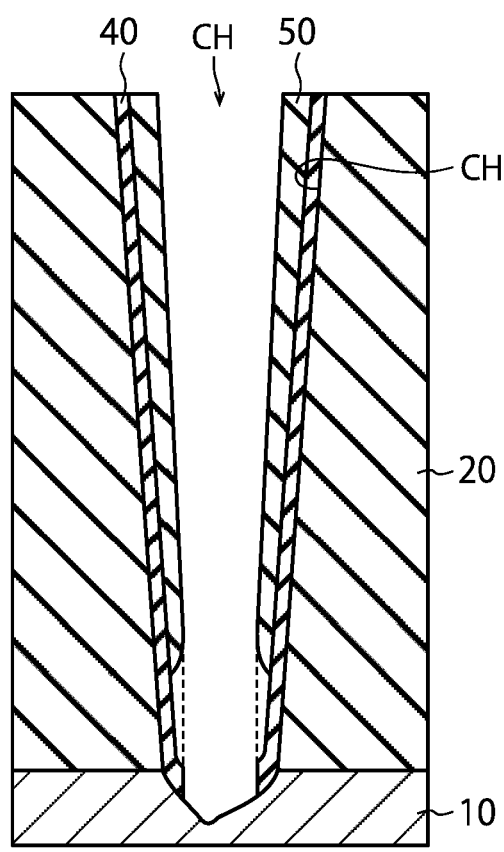
FIG. 8 is a sectional view showing an example of the manufacturing method of the semiconductor device, following to FIG. 7.

Subsequently, as shown in FIG. 8, using the second side-wall film 50 as a mask, the first side-wall film 40 formed on the bottom surface of the contact hole CH is etched by RIE until the lower layer 10 is exposed. In this way, since the second side-wall film 50 functions as a mask, without excessive removal of the first side-wall film 40 of a comparatively small thickness present on the side wall of the contact hole CH, the first side-wall film 40 of a comparatively large thickness present on the bottom of the contact hole CH can be selectively removed, with no failure. Therefore, while the side-wall films 40 and 50 are formed on the side surface of the interlayer insulating film 20, as the spacer film, the lower layer 10 can be exposed to the bottom of the contact hole CH, with no failure.

Figure 9:
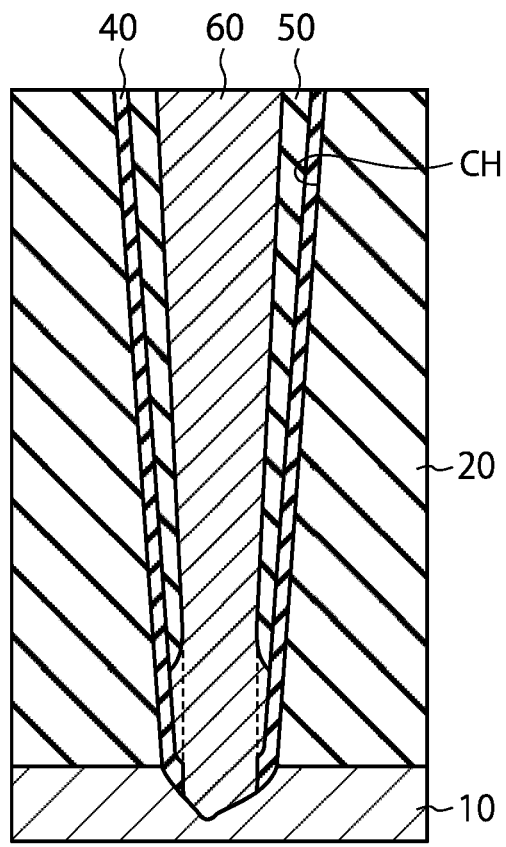
FIG. 9 is a sectional view showing an example of the manufacturing method of the semiconductor device, following to FIG. 8.

Subsequently, as shown in FIG. 9, a material of the contact plug 60 is embedded in the contact hole CH. The material of the contact plug 60 is, for example, a low-resistive metal material such as tungsten. Subsequently, the material of the contact plug 60 is flattened by CMP to form the contact plug 60.

Thereafter, another interlayer insulating film, wiring layer, or memory cell array (not shown), etc. are formed to complete the semiconductor device 1 according to the present embodiment.

According to the present embodiment, the contact hole CH has, not a flat, but an uneven bottom shape. However, the first side-wall film 40 covers the entire inner wall of the contact hole CH at a comparatively small thickness under a film forming condition with good coverage, whereas the second side-wall film 50 covers the upper portion of the inner wall of the contact hole CH under a film forming condition with bad coverage. The second side-wall film 50 is not provided at the lower portion of the contact hole CH.

Accordingly, the spacer film to be provided on the bottom of the contact hole CH is formed with the comparatively-thin first side-wall film 40. Therefore, the first side-wall film 40 can be removed by etching relatively easily. On the other hand, at the upper side surface of the contact hole CH, two layers of the first and second side-wall films 40 and 50 are formed at a comparatively larger thickness than the lower side surface of the contact hole CH. Therefore, the second side-wall film 50 functions as a mask in etch back of the first side-wall film 40 on the bottom of the contact hole CH. Accordingly, without excessive removal of the first and second side-wall films 40 and 50 on the side wall of the contact hole CH, the first side-wall film 40 on the bottom of the contact hole CH can be selectively removed with no failure. As a result, as shown in FIG. 9, the contact plug 60 can have low-resistive contact with the lower layer 10.

Modification Example

In the above embodiment, the supply amounts of the film-forming source gases are different in the formation of the first and second side-wall films 40 and 50 to differentiate the coverage of both films.

Different from above, in the present modification example, in order to differentiate the coverage of the first and second side-wall films 40 and 50, the supply time of the film-forming source gas for the second side-wall film 50 is set shorter than the supply time of the film-forming source gas for the first side-wall film 40. In the case of constant gas flow rate, the supply amount of the aminosilane-based gas may be controlled in time. Accordingly, the supply amount of the film-forming source gas for the second side-wall film 50 is practically smaller than the supply amount of the film-forming source gas for the first side-wall film 40. For example, the film-forming time of the first side-wall film 40 is set at about 10 times the film-forming time of the second side-wall film 50. In this case, the other film-forming conditions may be the same as each other for the first and second side-wall films 40 and 50. For example, the flow rates of the film-forming source gases for the first and second side-wall films 40 and 50 may be the same as each other, with film-forming temperatures of 300° C. and 100° C. or lower, respectively. Accordingly, the comparatively-thin first side-wall film 40 can be formed on the entire inner surface of the contact hole CH with good coverage, whereas the comparatively-thick second side-wall film 50 can be formed only on the upper inner surface of the contact hole CH with bad coverage, with no loss of the effect of the present embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device comprising:

forming a first film on a lower layer;

forming a contact hole in the first film, the contact hole reaching the lower layer from an upper surface of the first film;

supplying a film-forming source gas of a first supply amount to form a first side-wall film on a bottom surface in and a side surface in the contact hole;

supplying the film-forming source gas at a second supply amount smaller than the first supply amount to form a second side-wall film on an upper portion of the side surface, without forming the second side-wall film on the bottom surface and a lower portion of the side surface in the contact hole;

etching the first side-wall film formed on the bottom surface of the contact hole using the second side-wall film as a mask, until the lower layer is exposed; and embedding a conductor in the contact hole, wherein a silicon oxide film or a silicon nitride film is used for the first and second side-wall films.

2. The manufacturing method of the semiconductor device according to claim 1, wherein a supply time of the film-forming source gas in formation of the second side-wall film is shorter than a supply time of the film-forming source gas in formation of the first side-wall film.

3. The manufacturing method of the semiconductor device according to claim 1, wherein, after formation of the second side-wall film, the first side-wall film is provided between the conductor at a lower portion of the contact hole and the side wall in the contact hole, whereas the second side-wall film is not provided therebetween, and the first and second side-wall films are provided between the conductor at an upper portion of the contact hole and the side wall in the contact hole.

4. The manufacturing method of the semiconductor device according to claim 2, wherein, after formation of the second side-wall film, the first side-wall film is provided between the conductor at a lower portion of the contact hole and the side wall in the contact hole, whereas the second side-wall film is not provided therebetween, and the first and second side-wall films are provided between the conductor at an upper portion of the contact hole and the side wall in the contact hole.

* * * * *